United States Patent
Thean et al.

(10) Patent No.: US 7,091,071 B2
(45) Date of Patent: Aug. 15, 2006

(54) SEMICONDUCTOR FABRICATION PROCESS INCLUDING RECESSED SOURCE/DRAIN REGIONS IN AN SOI WAFER

(75) Inventors: Voon-Yew Thean, Austin, TX (US); Brian J. Goolsby, Austin, TX (US); Bich-Yen Nguyen, Austin, TX (US); Thien T. Nguyen, Austin, TX (US); Tab A. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/028,811

(22) Filed: Jan. 3, 2005

(65) Prior Publication Data

US 2006/0148196 A1     Jul. 6, 2006

(51) Int. Cl.
  *H01L 21/00*     (2006.01)
(52) U.S. Cl. .................. 438/149; 438/151; 438/300
(58) Field of Classification Search ............ 439/149, 439/287–309; 438/149–154, 300
See application file for complete search history.

(56) References Cited

U.S. PATENT DOCUMENTS

| 6,121,659 | A | * | 9/2000 | Christensen et al. ........ 257/347 |
| 6,420,218 | B1 | | 7/2002 | Yu |
| 2003/0132504 | A1 | * | 7/2003 | Bertin et al. ................ 257/530 |

* cited by examiner

*Primary Examiner*—H. Jey Tsai

(57) ABSTRACT

A method of forming a transistor with recessed source/drains in an silicon-on-insulator (SOI) wafer includes forming isolation structures in an active layer of the wafer, where the isolation structures preferably extend through the active layer to a BOX layer of the wafer. An upper portion of the active layer is removed to form a transistor channel structure. A gate dielectric is formed on the channel structure and a gate structure is formed on the gate dielectric. Etching through exposed portions of the gate dielectric, channel structure, and BOX layer is performed and source/drain structures are then grown epitaxially from exposed portions of the substrate bulk. The isolation structure and the BOX layer are both comprised primarily of silicon oxide and the thickness of the isolation structure prevents portions of the BOX layer from being etched.

20 Claims, 4 Drawing Sheets

SEMICONDUCTOR FABRICATION PROCESS INCLUDING RECESSED SOURCE/DRAIN REGIONS IN AN SOI WAFER

FIELD OF THE INVENTION

The present invention is in the field of semiconductor fabrication processes and, more particularly, fabrication processes that use silicon-on-insulator starting material.

RELATED ART

In the field of semiconductor fabrication processes, silicon-on-insulator (SOI) wafers have been used to reduce junction capacitance that can impede device performance. An SOI wafer includes a thin top layer of silicon on an underlying oxide layer. Transistors are formed in the thin top layer resulting in very shallow source/drain regions. While shallow source/drain regions are desirable to reduce junction capacitance, they can also exhibit an undesirable increased impedance effect characterized as an external resistance in series with the transistor. Elevated source/drain regions, in which source/drain structures are formed substantially above the original wafer surface have been used to address this latter problem. Elevated source/drain regions, however, increase the overlap capacitance with the transistor gate and can produce current crowding effects. It would be desirable, therefore, to capture the benefits of SOI wafers in combination with relatively thick source/drain regions without suffering the negative effects of elevated source drain regions and without substantially increasing the complexity of the process.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the invention contemplates a semiconductor fabrication processes that employs recessed source/drain structures and an SOI starting material. The recessed source/drain requires the removal of a portion of the SOI buried oxide (BOX) layer. The remaining portion of the BOX layer provides isolation between adjacent devices. This selective removal of the BOX layer does not require a dedicated photolithography (i.e., mask) step according to the present invention.

Figure 1:
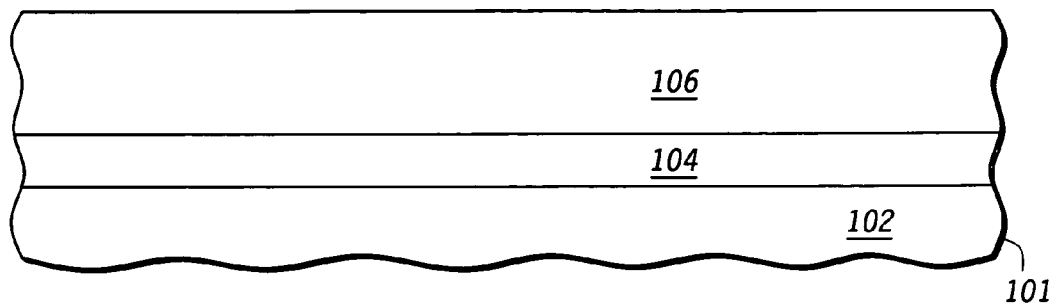
FIG. 1 is a partial cross section view of a silicon on insulator wafer.

Referring now to the drawings, FIG. 1 is a partial cross sectional view of an SOI wafer 101 that is used as the starting material for the present invention. Wafer 101 includes a wafer bulk 102, a BOX layer 104 overlying bulk 102, and an active layer 106 (sometimes referred to as top layer 106). Wafer bulk 102 is preferably a semiconductor material such as silicon. BOX layer 104 is preferably a silicon dioxide layer with a thickness of approximately 50 nm. Active layer 106 is preferably a semiconductor such as silicon or silicon germanium. Active layer 106 is preferably an epitaxial layer and preferably has a thickness of approximately 100 nm.

Figure 2:
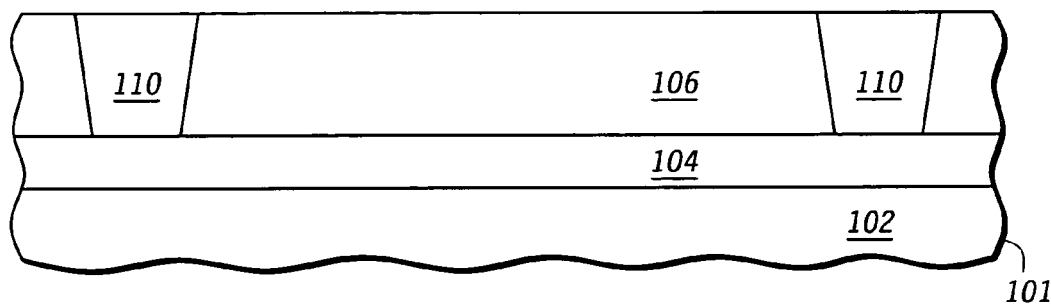
FIG. 2 depicts fabrication processing performed on the wafer of FIG. 1 according to an embodiment of the present invention wherein isolation structures are formed in the active layer of the SOI wafer.

Referring now to FIG. 2, isolation structures 110 are formed in active layer 106. The depicted embodiment of isolation structures are shallow trench isolation structures formed of a suitable dielectric such as silicon oxide. In the depicted embodiment, isolation structures 110 extend entirely through active layer 106 to contact BOX layer 104. Isolation structures 110 mask or protect the underlying portions of BOX layer 104 when other portions of BOX layer 104 are etched as part of the recessed source/drain formation process. In embodiments where isolation structures 110 and BOX layer 104 are of the same material (e.g., silicon oxide), the etch rates of isolation structures 110 and BOX layer 104 are roughly comparable. In such embodiments, to ensure that the thickness of isolation structures 110 is sufficient to protect the underlying portions of BOX layer 104, the thickness of isolation structures 110 preferably exceeds the thickness of BOX layer 104 by a considerable margin. In the preferred embodiment, isolation structures 110 are at least twice as thick as BOX layer 104.

Figure 3:
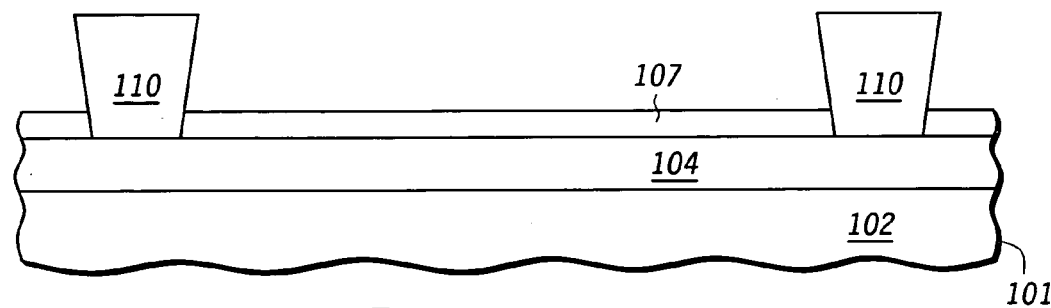
FIG. 3 depicts processing subsequent to FIG. 2 in which a transistor channel structure is formed from the active layer.

Referring now to FIG. 3, a transistor channel structure 107 is formed overlying BOX layer 104 between a pair of isolation structures 110. In the depicted embodiment transistor channel structure 107 is formed from top layer 106 by etching or otherwise removing a majority of top layer 106. The etch process used to form transistor channel structure 107 is preferably highly selective to isolation structures 110 so that a majority of isolation structures 110 remains after transistor channel structure 107 is formed. In one embodiment, transistor channel structure 107 as shown in FIG. 3 has a thickness of approximately 50 nm.

Figure 4:
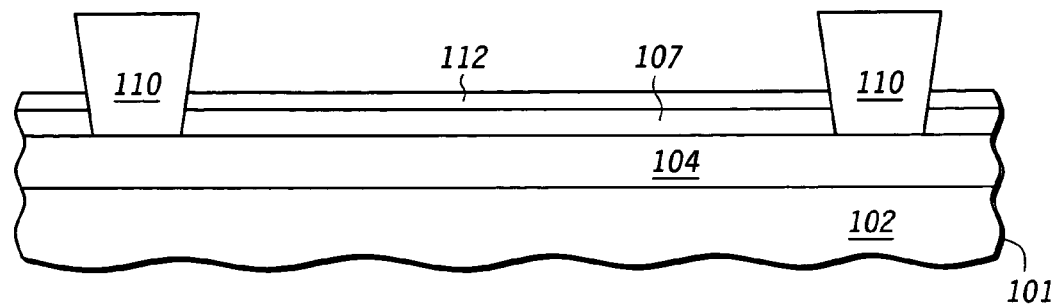
FIG. 4 depicts processing subsequent to FIG. 3 in which a sacrificial oxide is formed on the transistor channel structure.

Referring now to FIG. 4, a sacrificial film 112 is formed overlying transistor channel structure 107. In an embodiment where transistor channel structure 107 is silicon, sacrificial film 112 is preferably thermally formed silicon dioxide. In this embodiment, it will be appreciated that sacrificial film consumes a portion of transistor channel structure 107 as it is formed. Sacrificial film 112 beneficially consumes defects in the crystalline structure at the upper surface of transistor channel structure 107 as is known in the field of semiconductor fabrication processes.

Figure 5:
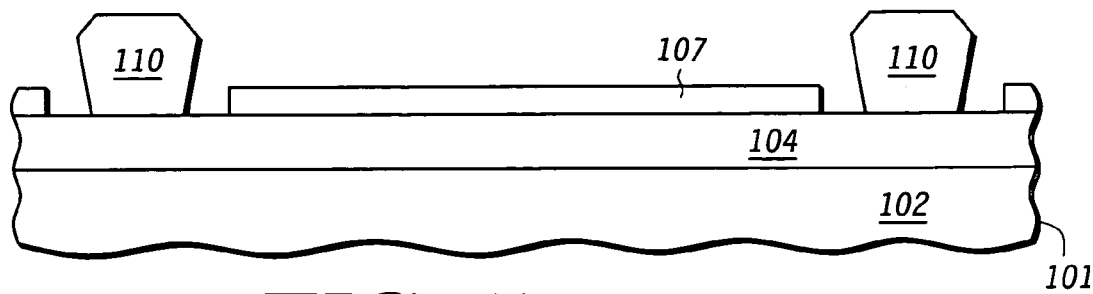
FIG. 5 depicts processing subsequent to FIG. 4 in which the sacrificial oxide is removed.

Referring now to FIG. 5, sacrificial film 112 is removed. In an embodiment where sacrificial film 112 is a silicon oxide, removal of the film may be achieved using a wet etch process such as by dipping wafer 101 in an HF solution. In this embodiment, it will be appreciated that portions of isolation structure 110 are removed during the sacrificial film removal such that the resulting transistor channel structure 107 no longer contacts isolation structures 110 at its ends.

Figure 6:
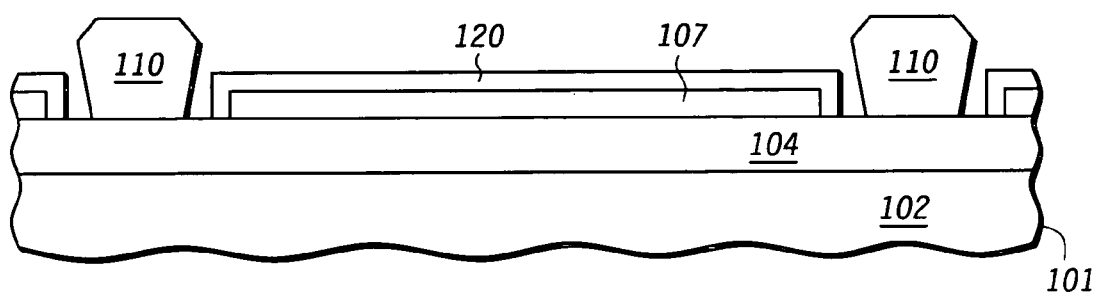
FIG. 6 depicts processing subsequent to FIG. 5 in which a gate dielectric is formed on the transistor channel structure.

Referring now to FIG. 6, a gate dielectric 120 is formed overlying transistor channel structure 107. In one embodiment, gate dielectric 120 is a thermally formed silicon dioxide having a thickness of less than approximately 30 nm. In another embodiment, gate dielectric 120 is a high dielectric constant dielectric, which, for purposes of this disclosure, is any dielectric having a dielectric constant that is greater than the dielectric constant of silicon dioxide (approximately 3.9). Suitable high dielectric constant dielectric candidates include metal oxide compounds such as $HfO_2$. In the high dielectric constant embodiment, the effective oxide thickness (EOT) of gate dielectric 120 is preferably less than approximately 30 nm. In some embodiments, such as the embodiment depicted in FIG. 6, gate dielectric 120 forms over all exposed surfaces of transistor channel structure 107, including over and along the sidewalls of transistor channel structure 107.

Figure 7:
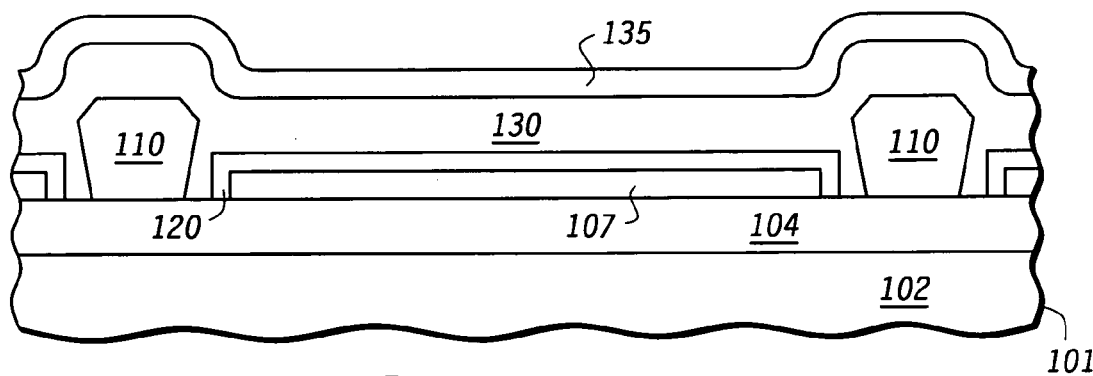
FIG. 7 depicts processing subsequent to FIG. 6 in which a conductive layer and a capping layer are formed on the gate dielectric.

Referring now to FIG. 7, a conductive layer 130 is formed overlying gate dielectric 120 and a capping layer 135 is formed overlying conductive layer 130. Conductive layer 130, according to one embodiment, is polycrystalline silicon formed in a conventional manner such as the thermal decomposition of silane. In this embodiment, conductive layer 130 may be heavily doped either in situ or by with a subsequent ion implantation process according to known processes. In other embodiments, the conductive layer 130 may be composed of a metal material such as titanium, tungsten, tantalum and alloys and compounds thereof such as titanium nitride, tantalum silicon, and tantalum silicon nitride.

In one embodiment, capping layer 135 serves to protect the underlying conductive layer 130 and to provide an antireflective coating (ARC) layer over conductive layer 130. (Capping layer 135 may also be referred to as ARC layer 135). ARC layers reduce standing wave patterns that occur when a subsequently deposited photoresist (not shown) is exposed to radiation. In one embodiment suitable for protecting conductive layer 130 and providing an ARC layer, capping layer 135 is a silicon nitride film, which preferably has a thickness of approximately 10 to 25 nm.

Figure 8:
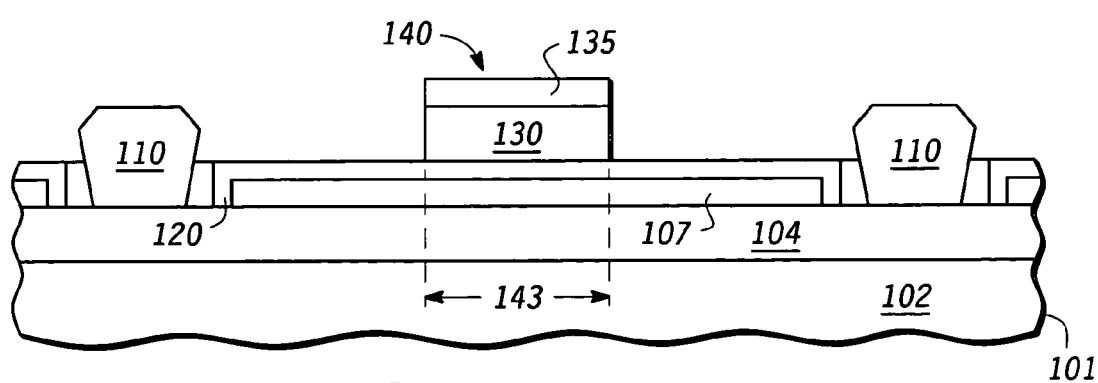
FIG. 8 depicts processing subsequent to FIG. 7 in which the conductive layer and the capping layer are etched to form a gate electrode.

Referring now to FIG. 8, conductive layer 130 and capping layer 135 are patterned to form a gate electrode 140. Patterning of conductive layer 130 and capping layer 135 is achieved using conventional photolithographic and etch processing. The sidewalls of gate electrode 140 define the boundaries of a first channel region or drawn channel region 143 in transistor channel structure 107 underlying gate electrode 140. The lateral dimension (length) of drawn channel region 143 is preferably less than 200 nm.

Figure 9:
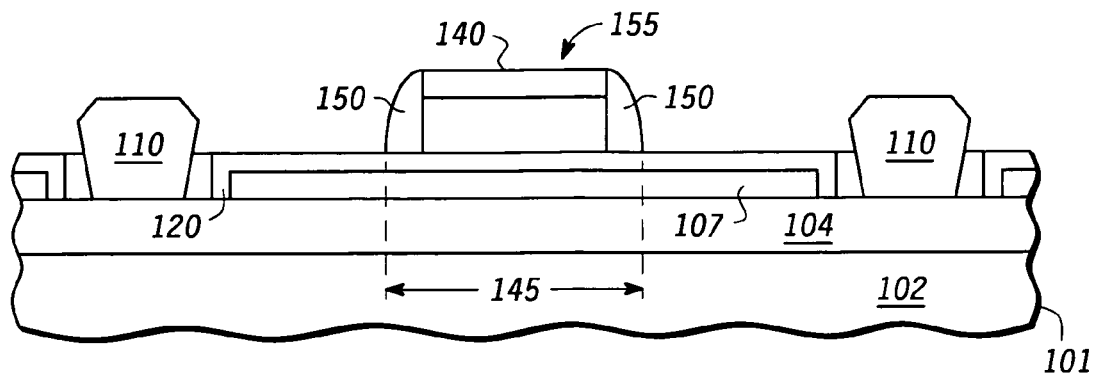
FIG. 9 depicts processing subsequent to FIG. 8 in which spacers are formed on the gate electrode sidewalls.

Referring now to FIG. 9, spacer structures 150 are formed on sidewalls of gate electrode 140. Formation of spacer structures 150 is achieved by depositing a conformal film overlying wafer 101 and then anisotropically etching the film as is well known. The combination of gate electrode 140 and sidewall spacers 150 is referred to herein as gate electrode structure 155 or, more simply, gate structure 155. The lateral boundaries of gate structure 155 define a second or effective channel region 145 that is slightly wider than the drawn channel region 143. Effective channel region 145 defines the boundaries of source/drain structures that will be formed subsequently. The formation of gate structure 155 exposes portions of gate dielectric 120 and transistor channel structure 107 that are exterior to effective channel region 145. In some embodiments, some form of ion implantation may be performed prior to forming spacers 150. Such implants could include extension implants, halo implants, and the like as will be familiar to those knowledgeable in semiconductor fabrication processes.

Figure 10:
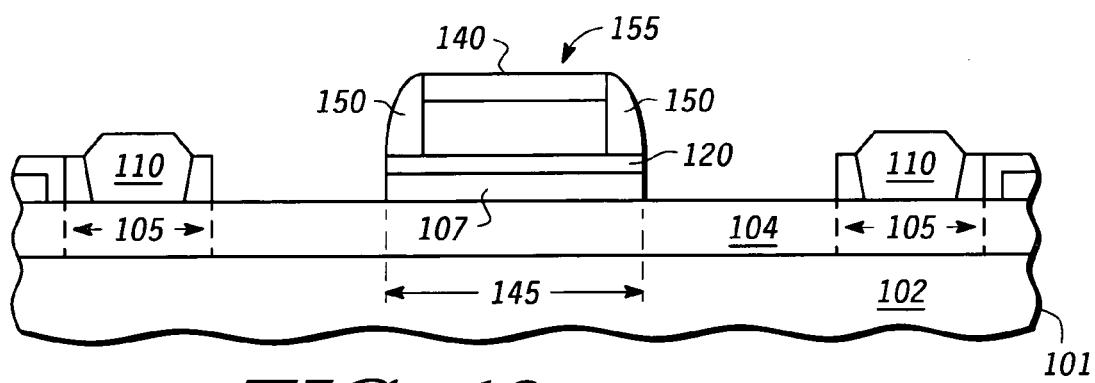
FIG. 10 depicts processing subsequent to FIG. 9 in which exposed portions of the gate dielectric and transistor channel are etched.

Referring now to FIG. 10, exposed portions of gate dielectric 120 and channel transistor channel structure 107 (i.e., those portions of gate dielectric 120 and transistor channel structure 107 not underlying gate electrode 140 or spacers 150), are removed. Removal of the exposed portions of gate dielectric 120 and transistor channel structure 107 exposes portions of box layer 104 that are not underlying gate structure 155. (A skilled artisan recognizes some undercutting of gate dielectric 120 and transistor channel structure 107 during removal) A conventional fluorine or chlorine based, plasma assisted dry etch process is used to perform the etch depicted in FIG. 10. Comparison of FIG. 10 and FIG. 9 reveals that the etch process of FIG. 10 erodes isolation structures 110. In the preferred embodiment, the thickness of the remaining portion of isolation structures is greater than the thickness of BOX layer 104 so that isolation structures 110 will be able to provide an effective mask for the portion of BOX layer 104 underlying isolation structures 110 during a subsequent etch of BOX layer 104. FIG. 10 also depicts isolation portions 105 of BOX layer 104. Isolation portions 105 of BOX layer 104 include portions of BOX layer 105 underlying isolation structures 110. Isolation portions 105 represent portions of BOX layer 104 that will remain after a subsequent dielectric etch (described below). The lateral dimensions of isolation portions 105 may be somewhat greater than the lateral dimensions of isolation structures 110 due to shadowing effects.

Figure 11:
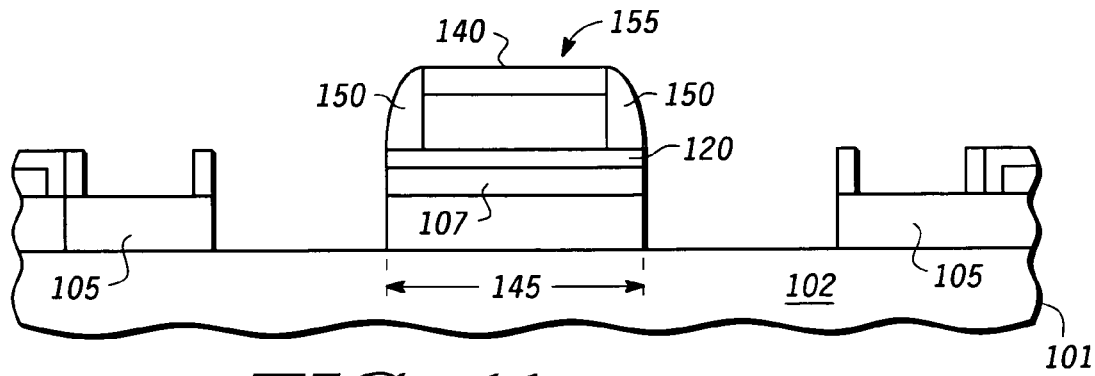
FIG. 11 depicts processing subsequent to FIG. 10 in which exposed portions of the buried oxide layer are removed.

Referring now to FIG. 11, the exposed portions of BOX layer 104 are etched to expose underlying portions of wafer bulk 102. The presence of the remaining portions of isolation structures 110 during the etch depicted in FIG. 10 protect the isolation portions 105 of BOX layer 104 from the etch. Following etching of the exposed portions of BOX layer 104, the isolation structures 110 are removed, but the isolation portions 105 of BOX layer 104 remain. The isolation portions 105 of BOX layer 104 will provide physical and electric isolation for adjacent source/drain structures that are to be formed subsequently. By using the isolation structures 110 to protect isolation portions 105 of BOX layer 104, the described processing provide a method of patterning the BOX layer that does not require a photolithography process to define the areas of BOX layer 104 that are to be removed. While the formation of isolation dielectric 110 requires a masking step, this masking step is performed prior to the formation of gate electrodes 140 and is, therefore, much less demanding in terms of its registration requirements. Masks formed after definition of the transistor gate and source/drain regions must be precisely aligned to prevent unintended etch of the transistor regions. This registration issue can be especially important in densely spaced designs as is typical of, for example, memory arrays.

Although etching the exposed portions of gate dielectric 120 and transistor channel structure 107 is depicted as a distinct processing step from the etching of the exposed portions of BOX layer 104, these etch processes may be combined in a single etch process where the etch process may have multiple phases such as a first phase to remove gate dielectric 120, a second phase to etch transistor channel structure 107, and a third phase to etch BOX layer 104.

Figure 12:
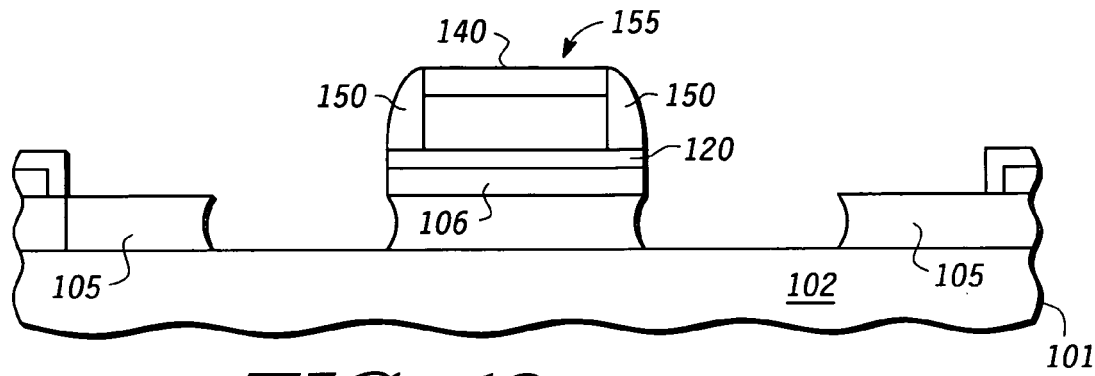
FIG. 12 depicts processing subsequent to FIG. 11 in which an HF dip is performed to clean exposed portions of the wafer bulk and the transistor channel.

Referring now to FIG. 12, a cleaning step preparatory to the formation of recessed source/drain structures is performed. In the preferred embodiment, the cleaning step includes an HF dip to remove any residual oxide on the upper surface of wafer bulk 102. The HF dip is also shown as removing a small portion of the isolation portions 105 of the BOX layer.

Figure 13:
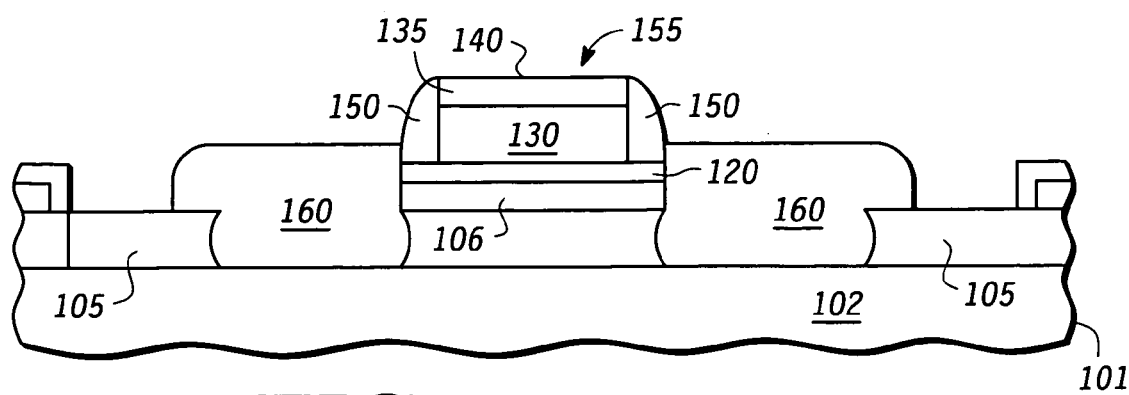
FIG. 13 depicts processing subsequent to FIG. 12 in which recessed source/drain structures are formed using an epitaxial growth process.

Referring now to FIG. 13, recessed source/drain structures 160 are formed. Recessed source/drain structures 160 are preferably epitaxial structures that are thermally formed (grown) using wafer bulk 102 as a seed. Recessed source/drain structures are so named because a significant portion of the structures are vertically displaced (recessed) below the upper surface of the original BOX layer 104. Recessing the source/drain structures beneficially reduces current crowding and overlap capacitance that is associated with elevated source/drain structures used in some SOI technologies.

Recessed source/drain structures 160 are silicon structures in one embodiment. In another embodiment suitable for use in the formation of PMOS transistors, recessed source/drain structures 160 are silicon germanium, silicon carbide, silicon germanium carbon, in situ doped silicon germanium, or another suitable semiconductor material. Isolation between recessed source/drain structures 160 and they underlying wafer bulk 102 may be achieved using one or more deep implants. In this embodiment, the deep implant would produce a conductivity type in wafer bulk 102 that is opposite the conductivity type of source/drain structures 160. In some implementations, it may be desirable to use a first such deep implant to achieve this junction isolation for PMOS regions of the wafer and a second deep implant to achieve junction isolation for NMOS regions of the wafer. In other embodiments, the relatively high resistance of wafer bulk 102 may be sufficient to achieve effective electrical isolation. In any event, the formation of recessed source/drain structures 160 results in the formation of a transistor 100 that when appropriate connected to other such transistors formed in wafer 101, produce an integrated circuit.

In the foregoing specification, the invention has been described with reference to specific embodiments. However, one of ordinary skill in the art appreciates that various modifications and changes can be made without departing from the scope of the present invention as set forth in the claims below. For example, although wafer bulk 102 is described as including silicon, other semiconductor materials including gallium arsenide and silicon germanium might be used for the bulk. Similarly, active layer 106 may, as an alternative to silicon, include silicon germanium or the like. Spacer structures 150, although being described as silicon nitride, might include additional materials such as a thin oxide layer between the silicon nitride and the gate electrode. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, comprising:
   forming isolation trench structures in an active layer of a silicon on insulator (SOI) wafer;
   thinning the active layer to form a channel structure by etching the active layer selectively with respect to the isolation trenches;
   forming a gate dielectric overlying the channel structure;
   forming a gate structure overlying the gate dielectric;
   using the gate structure as a mask, removing exposed portions of the gate dielectric and the underlying channel structure to expose portions of a buried oxide (BOX) layer of the SOI wafer;
   etching through exposed portions of the BOX layer to exposed portions of a substrate bulk of the SOI wafer, wherein the presence of the isolation trench structures overlying isolation portions of the BOX prevents the isolation portions of the BOX from being removed during said etching; and
   epitaxially growing semiconductor source/drain structures from exposed portions of the substrate bulk, wherein adjacent semiconductor source/drain structures are isolated from one another by the isolation portions of the BOX layer.

2. The method of claim 1, wherein forming the gate dielectric comprises thermally forming a silicon oxide gate dielectric.

3. The method of claim 1, wherein forming the gate dielectric comprises depositing a high dielectric constant gate dielectric.

4. The method of claim 1, wherein forming the gate structure comprises forming a gate electrode by:
   forming a conductive layer overlying the gate dielectric; and
   forming an antireflective coating (ARC) overlying the conductive layer; and
   patterning the conductive layer and the ARC to form the gate electrode.

5. The method of claim 4, wherein the ARC comprises silicon nitride.

6. The method of claim 5, wherein the conductive portion comprises polycrystalline silicon.

7. The method of claim 5, wherein the conductive portion comprises a metal.

8. The method of claim 3, further comprising forming dielectric spacers structures on sidewalls of the gate electrode.

9. The method of claim 1, wherein epitaxially growing the semiconductor source/drain structures comprises epitaxially growing silicon source/drain structures.

10. The method of claim 1, wherein epitaxially growing the semiconductor source/drain structures comprises epitaxially growing silicon germanium source/drain structures.

11. A method of patterning a buried oxide layer (BOX) of a silicon on insulator (SOI) wafer, comprising:
   forming dielectric isolation structures in an active layer of the SOI wafer, the isolation dielectric structures overlying isolation portions of the BOX layer;
   forming a transistor channel structure overlying the BOX layer by thinning the active layer selectively with respect to the isolation trenches and forming a gate dielectric overlying the channel structure;
   forming a gate structure overlying the gate dielectric;
   etching through portions of the transistor channel structure, gate dielectric and BOX layer not masked by the gate structure, wherein the presence of the isolation structures during said etching prevents said etching from removing the isolation portions of the BOX layer.

12. The method of claim 11, wherein a thickness of the dielectric isolation structures exceeds a thickness of the BOX layer.

13. The method of claim 11, wherein forming the transistor channel structure comprises etching a majority of the active layer.

14. The method of claim 11, wherein the gate dielectric is selected from the group consisting of thermally formed silicon dioxide and a high dielectric constant material.

15. The method of claim 11, wherein forming the gate structure includes depositing a conductive layer, depositing an dielectric capping layer overlying the conductive layer, etching the conductive layer and the dielectric capping layer to form a gate electrode, and forming dielectric spacers on sidewalls of the gate electrode.

16. A method of forming a transistor with recessed source/drains using a silicon on insulator (SOI) wafer, the SOI wafer comprising an active layer overlying a buried oxide (BOX) layer overlying a substrate bulk, comprising:
   forming isolation structures in the active layer of the SOI wafer, wherein the isolation structures extend through the active layer to the BOX layer;
   removing an upper portion of the active layer between adjacent isolation trenches to form a transistor channel structure;
   forming a gate dielectric on the channel structure;
   forming a gate structure on the gate dielectric; and
   etching through portions of the gate dielectric, channel structure, and BOX layer not masked by the gate structure or the isolation trenches; and
   growing source/drain structures epitaxially from portions of the substrate bulk exposed by said etching.

17. The method of claim 16, wherein the source/drain structures have a first conductivity type and further comprising, performing a deep implant, using an impurity of a second conductivity type, into the bulk substrate.

18. The method of claim 16, removing an upper portion of the active layer comprises etching a majority of the active layer.

19. The method of claim 16, wherein forming the gate structure includes forming a gate electrode and forming dielectric spacers on sidewalls of the gate electrode.

20. The method of claim 16, wherein the isolation structure and the BOX layer are both comprised primarily of silicon oxide and wherein the thickness of the isolation structure prevents the isolation portions of the BOX layer from being etched during said etching.

* * * * *